(12) United States Patent
Ikura

(10) Patent No.: US 8,816,399 B2
(45) Date of Patent: Aug. 26, 2014

(54) SEMICONDUCTOR DEVICE

(71) Applicant: Advanced Power Device Research Association, Yokohama (JP)

(72) Inventor: Yoshihiro Ikura, Kanagawa (JP)

(73) Assignees: Furukawa Electric Co., Ltd., Yokohama-shi (JP); Fuji Electric Co., Ltd., Kawasaki-shi (JP)

( * ) Notice: Subject to any disclaimer, the term of this patent is extended or adjusted under 35 U.S.C. 154(b) by 0 days.

(21) Appl. No.: 13/937,557

(22) Filed: Jul. 9, 2013

(65) Prior Publication Data
US 2014/0097473 A1   Apr. 10, 2014

(30) Foreign Application Priority Data

Oct. 9, 2012   (JP) ................................. 2012-224356

(51) Int. Cl.
*H01L 29/66*   (2006.01)
(52) U.S. Cl.
USPC ........................... 257/194; 257/472; 257/488
(58) Field of Classification Search
CPC ..... H01L 29/47; H01L 29/402; H01L 29/778; H01L 29/2003; H01L 33/007
USPC ......................... 257/194, 472, 488
See application file for complete search history.

(56) References Cited

U.S. PATENT DOCUMENTS

| 8,541,818 | B2 * | 9/2013 | Wu et al. | 257/194 |
| 2006/0054924 | A1 * | 3/2006 | Saito et al. | 257/192 |
| 2012/0218783 | A1 * | 8/2012 | Imada | 363/17 |
| 2012/0267687 | A1 * | 10/2012 | Jeon et al. | 257/194 |
| 2014/0004669 | A1 * | 1/2014 | Oka | 438/172 |

FOREIGN PATENT DOCUMENTS

JP   2007-134608   5/2007
WO  WO 2011/162243 A1   12/2011

* cited by examiner

*Primary Examiner* — Trung Q Dang
(74) *Attorney, Agent, or Firm* — Oblon, Spivak, McClelland, Maier & Neustadt, L.L.P.

(57) ABSTRACT

A semiconductor device includes: an electron transit layer formed on a substrate and of a group III nitride-based compound semiconductor; an electron supply layer formed on the electron transit layer and of a group III nitride-based compound semiconductor having a higher band gap energy than the transit layer; a field plate layer formed on the supply layer, formed of a non-p-type group III nitride-based compound semiconductor, and having a lower band gap energy than the supply layer; a first electrode forming an ohmic contact with a two-dimensional electron gas layer in the transit layer at an interface thereof with the supply layer; and a second electrode forming a Schottky contact with the electron gas layer. The second electrode forms an ohmic contact, at a side wall of the field plate layer, with two-dimensional hole gas in the field plate layer at an interface thereof with the supply layer.

7 Claims, 4 Drawing Sheets

SEMICONDUCTOR DEVICE

CROSS-REFERENCE TO RELATED APPLICATION

The present application claims priority to and incorporates by reference the entire contents of Japanese Patent Application No. 2012-224356 filed in Japan on Oct. 9, 2012.

BACKGROUND OF THE INVENTION

1. Field of the Invention

The present disclosure relates to a semiconductor device.

2. Description of the Related Art

A structure of a semiconductor device formed of a group III nitride-based compound semiconductor (e.g., a Schottky barrier diode), in which a GaN layer (GaN-FP layer) serving as a field plate is formed on an AlGaN/GaN heterostructure, has been disclosed conventionally. Further, there is also one in which an undoped GaN layer is formed between a GaN-FP layer and an AlGaN/GaN heterostructure (refer to WO 2011/162243 and Japanese Patent Application Laid-open No. 2007-134608).

With the above-described structure, two-dimensional electron gas is generated in the GaN layer at an interface between the GaN layer and the AlGaN layer, and two-dimensional hole gas is generated in the GaN-FP layer (or the undoped GaN layer) at an interface between the GaN-FP layer and the AlGaN layer.

When the two-dimensional hole gas forms an ohmic contact and is equipotential with an anode electrode, an electric field is exerted between the two-dimensional hole gas and the two-dimensional electron gas if a reverse bias is applied, and thus, the two-dimensional electron gas becomes easily depleted. Therefore, when the GaN-FP layer is formed at an end of the anode electrode, the electric field exerted on the end of the anode electrode upon reverse biasing becomes weak and thus a leakage current is expected to be suppressed.

However, with the structure in which a conductivity type of the GaN-FP layer where the two-dimensional hole gas is being generated is p-type, or with the structure in which the GaN-FP layer is not of p-type but a p-type GaN layer is formed thereon, the amount of the two-dimensional hole gas generated in the GaN-FP layer is increased. Accordingly, a concentration balance between the two-dimensional hole gas and the two-dimensional electron gas generated in the GaN layer under the AlGaN layer is lost. As a result, electrical field is concentrated at an end of the GaN-FP layer. The p-type GaN layer is doped mainly with magnesium (Mg) as a p-type dopant. As a result, mobility of holes is decreased and its difference from mobility of electrons is increased. Accordingly, concentration changes of the two-dimensional hole gas and the two-dimensional electron gas differ from each other upon switching of the semiconductor device, and the two-dimensional electron gas becomes difficult to be depleted, whereby electrical field is concentrated at the end of the GaN-FP layer. As a result, voltage endurance of the semiconductor device is decreased and leakage current is not effectively suppressed.

Accordingly, there is a need to provide a semiconductor device in which reduction in its voltage endurance is suppressed and its leakage current is effectively suppressed.

SUMMARY OF THE INVENTION

According to an aspect of the present invention, a semiconductor device includes: an electron transit layer that is formed on a substrate and formed of a group III nitride-based compound semiconductor; an electron supply layer that is formed on the electron transit layer and formed of a group III nitride-based compound semiconductor having a higher band gap energy than the electron transit layer; a field plate layer that is formed on the electron supply layer, is formed of a non-p-type group III nitride-based compound semiconductor, and has a lower band gap energy than the electron supply layer; a first electrode that is formed so as to form an ohmic contact with a two-dimensional electron gas layer generated in the electron transit layer at an interface between the electron transit layer and the electron supply layer; and a second electrode that is formed so as to form a Schottky contact with the two-dimensional electron gas layer. The second electrode forms an ohmic contact, at a side wall of the field plate layer, with two-dimensional hole gas generated in the field plate layer at an interface between the field plate layer and the electron supply layer.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
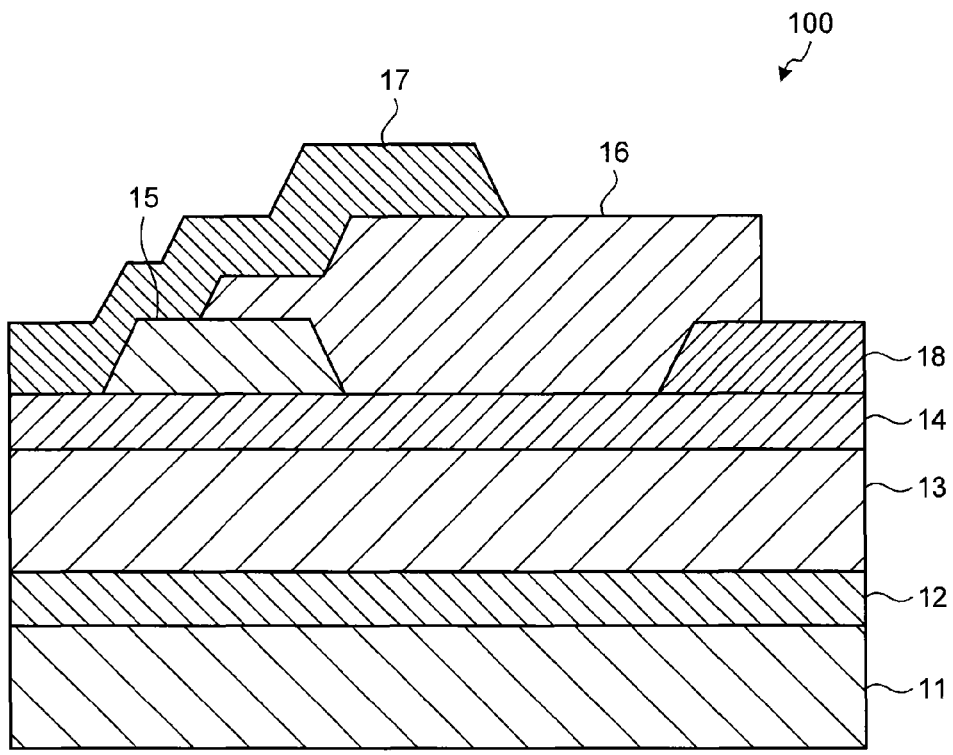
FIG. 1 is a schematic cross-sectional view of a semiconductor device according to a first embodiment.

Hereinafter, embodiments of a semiconductor device according to the present invention will now be described in detail with reference to the drawings. The present invention is not limited by the following embodiments. In the drawings, the same or corresponding elements are designated by the same reference numerals or symbols as appropriate, and redundant explanation thereof will be omitted as appropriate. Furthermore, it should be noted that the drawings are schematic, and relations among dimensions of the elements may differ from the actual. Portions having relations or ratios among their dimensions that differ among the drawings may be included.

First Embodiment

FIG. 1 is a schematic cross-sectional view of a Schottky barrier diode, which is a semiconductor device according to a first embodiment of the present invention. This semiconductor device 100 includes: an electron transit layer 13 formed on a substrate 11 via a buffer layer 12; an electron supply layer 14 formed on the electron transit layer 13; and a field plate layer 15, a passivation film 16, an anode electrode 17 as a second electrode, and a cathode electrode 18 as a first electrode, which are formed on the electron supply layer 14.

The substrate 11 is made of a material capable of being formed with a group III nitride-based compound semiconductor on a principal surface thereof, such as silicon, sapphire, or ZnO. The buffer layer 12 is for suitably forming a group III nitride-based compound semiconductor layer on the substrate 11, and has a publicly known structure in which AlN layers and GaN layers are alternately grown on each other, for example.

The electron transit layer 13 is made of undoped GaN, for example. The electron supply layer 14 is made of a group III nitride-based compound semiconductor, AlGaN for example, which has a higher band gap energy than the electron transit layer 13. An Al composition ratio of AlGaN is 0.25 for example, but not limited thereto, and may be 0.01 to 0.99 for example. A thickness of the electron supply layer 14 is 1 nm to 50 nm, and preferably 20 nm to 25 nm. At an interface between the electron transit layer 13 and the electron supply layer 14, a two-dimensional hole gas layer is generated.

The field plate layer 15 has a lower band gap energy than the electron supply layer 14 and is formed of a non-p-type group III nitride-based compound semiconductor. For example, the field plate layer 15 is formed of undoped GaN. A thickness of the field plate layer 15 is from 30 nm to 200 nm, and preferably 50 nm to 150 nm. In the field plate layer 15 at an interface between the field plate layer 15 and the electron supply layer 14, a two-dimensional hole gas layer is generated. Non-p-type means that a conductivity type is not p-type and is for example, undoped or n-type obtained by doping with an n-type impurity.

The passivation film 16 is made of SiN for example, and protects mainly a surface of the electron supply layer 14, where neither the field plate layer 15, the anode electrode 17, nor the cathode electrode 18 is formed.

The cathode electrode 18 is formed of a Ti/Al layered structure for example, so as to form an ohmic contact with the electron supply layer 14. This makes the cathode electrode 18 form an ohmic contact, via the electron supply layer 14, with the two-dimensional hole gas layer generated in the electron transit layer 13.

The anode electrode 17 is formed of a Ni/Au layered structure, for example, so as to form a Schottky contact with the electron supply layer 14. This makes the anode electrode 17 form a Schottky contact, via the electron supply layer 14, with the two-dimensional electron gas layer generated in the electron transit layer 13.

The anode electrode 17 and the field plate layer 15 contact with each other and extend toward the cathode electrode 18. The anode electrode 17 is formed so as to contact with a side surface and a part of a top surface of the field plate layer 15, for example, as illustrated in FIG. 1.

Figure 2:
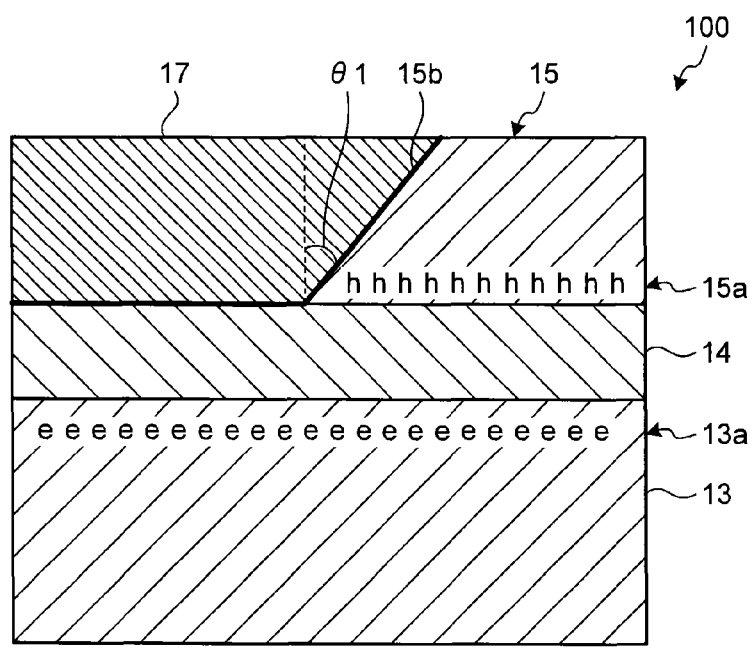
FIG. 2 is a diagram of main elements of the semiconductor device illustrated in FIG. 1.

Next, a contact state between the anode electrode 17 and the field plate layer 15 will be explained. FIG. 2 illustrates main elements of the semiconductor device 100 illustrated in FIG. 1, which are a part where the anode electrode 17 and the field plate layer 15 contact with each other. As illustrated in FIG. 2, in the electron transit layer 13 at an interface between the electron transit layer 13 and the electron supply layer 14, a two-dimensional electron layer 13a is generated. A two-dimensional hole gas layer 15a is generated in the field plate layer 15 at an interface between the filed plate layer 15 and the electron supply layer 14.

In the semiconductor device 100, the anode electrode 17 is formed so as to form an ohmic contact with the two-dimensional hole gas layer 15a generated in the field plate layer 15 at a side wall 15b of the field plate layer 15. Specifically, the side wall 15b of the field plate layer 15 is tilted, with respect to a plane perpendicular to a surface of the electron supply layer 14, by an angle θ1, oppositely to the anode electrode 17, whereby the ohmic contact is achieved.

When the two-dimensional hole gas layer 15a forms an ohmic contact with the anode electrode 17 as described above and is equipotential therewith, an electrical field is exerted between the two-dimensional hole gas layer 15a and the two-dimensional electron layer 13a if a reverse bias is applied, and thus, the two-dimensional electron layer 13a becomes easy to depleted at a relatively low voltage. Therefore, the electrical field exerted on an end of the anode electrode 17 becomes weak when a reverse bias is applied, whereby a leakage current is effectively suppressed.

In addition, the layer that is formed above the electron supply layer 14 and contacts with the anode electrode 17 (the field plate layer 15 herein) is of non-p-type, a concentration balance between the two-dimensional hole gas layer 15a and the two-dimensional electron layer 13a is maintained, and depletion upon switching is easily achieved. As a result, electrical field is prevented from concentrating at an end of the field plate layer 15, the end being nearer to the cathode electrode 18, thereby suppressing reduction in the voltage endurance. As illustrated in FIG. 1, in addition to the non-p-type field plate layer 15, the passivation film 16 is partly formed between the anode electrode 17 and the electron supply layer 14 or the field plate layer 15, thereby forming a multi-staged electric field reduction structure and further improving the voltage endurance.

Figure 8:
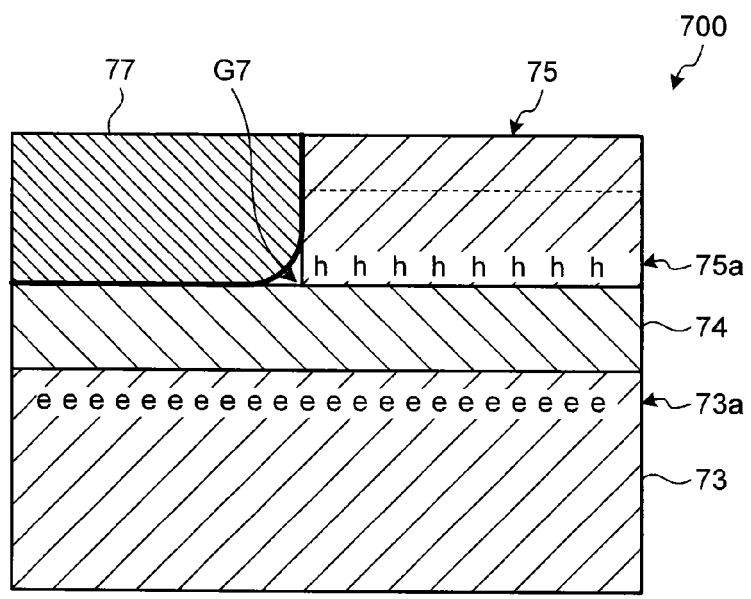
FIG. 8 is a schematic cross-sectional view of main elements of a semiconductor device in which an anode electrode does not form an ohmic contact with two-dimensional hole gas.

FIG. 8 is a schematic cross-sectional view of main elements of a semiconductor device 700 in which an anode electrode does not form an ohmic contact with two-dimensional hole gas. In the semiconductor device 700, in the same manner as the semiconductor device 100, a two-dimensional hole gas layer 75a is generated in an electron transit layer 73 at an interface between the electron transit layer 73 and the electron supply layer 74, and a two-dimensional electron gas layer 73a is generated in a field plate layer 75 at an interface between the field plate layer 75 and the electron supply layer 74.

However, a side wall of the field plate layer 75 is perpendicular to a surface of the electron supply layer 74, and therefore a gap G7 with the anode electrode 77 is generated at a corner formed between the side wall of the field plate layer 75 and the surface of the electron supply layer 74. Such a gap is considered to be due to an electrode material not sufficiently reaching the corner when the anode electrode 77 is formed by an electron beam vapor deposition method, for example. The two-dimensional hole gas layer 75a exists in a range of about a few nanometers from the interface between the field plate layer 75 and the electron supply layer 74, and thus if the gap G7 exists, the two-dimensional hole gas layer 75a does not contact with the anode electrode 77 or the contact becomes insufficient. The two-dimensional hole gas layer 75a then is floating, and no electrical field is exerted between the two-dimensional hole gas layer 75a and the two-dimensional electron gas layer 73a.

In order to prevent the generation of the gap G7, a tilt angle θ1 of the side wall 15b of the field plate layer 15 in the semiconductor device 100 is approximately 30 degrees to 60 degrees, and preferably 45 degrees.

The semiconductor device 100 is manufactured as follows. Firstly, semiconductor layers to become the buffer layer 12, the electron transit layer 13, the electron supply layer 14, and the field plate layer 15 are sequentially grown on the substrate 11 using a crystal growth method such as metal organic chemical vapor deposition (MOCVD). Thereafter, the field plate layer 15 is formed by eliminating portions of the semiconductor layer other than a desired region by selective etching. The side wall 15b of the field plate layer 15 is able to be tilted by a preferable angle θ1, by isotropic-etching the field plate layer 15.

After that, the cathode electrode 18 is formed using an electron beam vapor deposition method and a lift-off method, for example. Next, the passivation film 16 is formed using a plasma enhanced CVD (PECVD) method, a photo lithography technique, and etching, for example. The anode electrode 17 is subsequently formed using an electron beam vapor deposition method and a lift-off method.

The field plate layer 15 is of non-p-type, and thus Mg, for example, which is a p-type dopant, need not be doped. Accordingly, a situation in which Mg is dispersed to the interface between the electron transit layer 13 and the electron supply layer 14 in a thermal process in manufacturing the semiconductor device 100 or in an activating thermal treatment of Mg, for example, does not occur in the first place and a situation in which the mobility of the two-dimensional electron layer 13a is decreased and the forward characteristics are deteriorated thereby, does not occur either.

As described above, the semiconductor device 100 according to the first embodiment is a semiconductor device in which reduction in the voltage endurance is suppressed and a leakage current is effectively suppressed.

Second Embodiment

Figure 3:
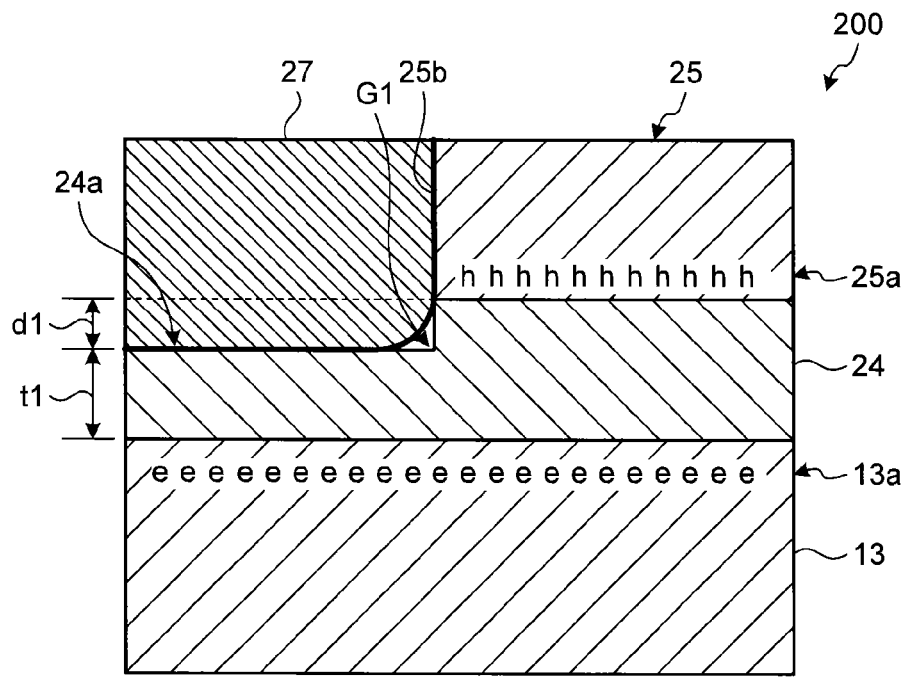
FIG. 3 is a schematic cross-sectional view of main elements of a semiconductor device according to a second embodiment.

FIG. 3 is a schematic cross-sectional view of main elements of a semiconductor device according to a second embodiment of the present invention. This semiconductor device 200 has a structure in which the electron supply layer 14, the field plate layer 15, and the anode electrode 17 of the semiconductor device 100 illustrated in FIG. 1 are respectively substituted with an electron supply layer 24, a field plate layer 25, and an anode electrode 27. Properties of preferred materials or the like for the substituted elements may be the same as the corresponding elements in the semiconductor device 100.

The electron supply layer 24 has a recessed portion 24a that is formed from a surface of the electron supply layer 24 to a predetermined depth d1 inside the electron supply layer 24. The recessed portion 24a is formed by etching, for example. A two-dimensional hole gas layer 25a is generated in the field plate layer 25 at an interface between the field plate layer 25 and the electron supply layer 24. A side wall 25b of the field plate layer 25 is approximately perpendicular to the surface of the electron supply layer 24. The anode electrode 27 is formed from inside the recessed portion 24a to the side wall 25b of the field plate layer 25.

The side wall 25b of the field plate layer 25 is approximately perpendicular to the surface of the electron supply layer 24 in the semiconductor device 200. However, the electron supply layer 24 has the recessed portion 24a and the anode electrode 27 is formed from inside the recessed portion 24a to the side wall 25b of the field plate layer 25. As a result, if a gap G1 is formed at a corner on the side wall 25b side of the recessed portion 24a, no gap exists between the anode electrode 27 and the field plate layer 25 from a bottom surface of the recessed portion 24a to a position at a height of the two-dimensional hole gas layer 25a. The anode electrode 27, therefore, is able to form an ohmic contact with the two-dimensional hole gas layer 25a at the side wall 25b.

To eliminate the gap between the anode electrode 27 and the field plate layer 25 at the height position of the two-dimensional hole gas layer 25a, the depth d1 of the recessed portion 24a from the surface of the electron supply layer 24 is preferably 10 nm or greater. Furthermore, a thickness t1 of the electron supply layer 24 at a portion directly under the recessed portion 24a is preferably 20 nm or greater so that a concentration of the two-dimensional electron gas layer 13a becomes sufficient in that portion directly under the recessed portion 24a, the portion being thinner than the other portion of the electron supply layer 24.

Third Embodiment

Figure 4:
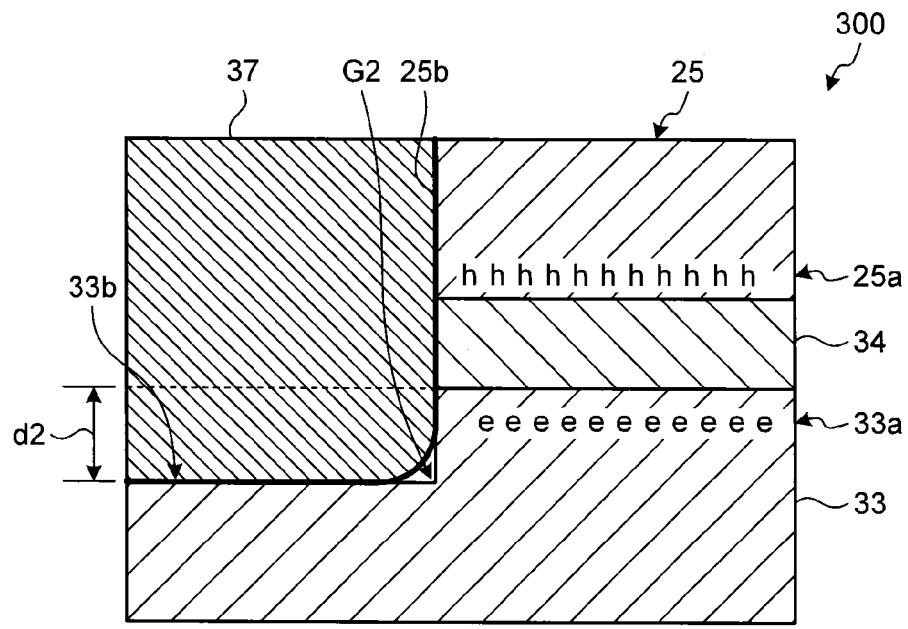
FIG. 4 is a schematic cross-sectional view of main elements of a semiconductor device according to a third embodiment.

FIG. 4 is a schematic cross-sectional view of main elements of a semiconductor device according to a third embodiment of the present invention. This semiconductor device 300 has a structure in which the electron transit layer 13, the electron supply layer 24, and the anode electrode 27 in the semiconductor device 200 illustrated in FIG. 3 are respectively substituted with an electron transit layer 33, an electron supply layer 34, and an anode electrode 37. Properties of preferred materials for the substituted elements may be the same as the corresponding elements in the semiconductor device 200, for example.

The semiconductor device 300 has therein a recessed portion 33b that is formed from a surface of the electron supply layer 34 penetrating through the electron supply layer 34 to a predetermined depth inside the electron transit layer 33. A two-dimensional electron layer 33a is generated in the electron transit layer 33 at an interface between the electron transit layer 33 and the electron supply layer 34. The side wall 25b of the field plate layer 25 is approximately perpendicular to the surface of the electron supply layer 34. The anode electrode 37 is formed from inside the recessed portion 33b to the side wall 25b of the field plate layer 25.

This semiconductor device 300 also has the recessed portion 33b and the anode electrode 37 is formed from inside the recessed portion 33b to the side wall 25b of the field plate layer 25. As a result, even if a gap G2 is formed at a corner on the side wall 25b side of the recessed portion 33b, no gap exists between the anode electrode 37 and the field plate layer 25 from the bottom surface of the recessed portion 33b to the position at the height of the two-dimensional hole gas layer 25a. The anode electrode 37, therefore, is able to form an ohmic contact with the two-dimensional hole gas layer 25a at the side wall 25b.

In addition, in the semiconductor device 300, the anode electrode 37 is able to form a Schottky contact directly with the two-dimensional electron layer 33a of the electron transit layer 33 at the side wall 25b. This lowers a Schottky barrier between the anode electrode 37 and the electron transit layer 33, thereby facilitating flow of forward electric current therebetween.

A depth d2 from the surface of the electron transit layer 33 to the bottom surface of the recessed portion 33b is not particularly limited as long as no gap exists between the anode electrode 37 and the field plate layer 25 at the height position of the two-dimensional hole gas layer 25a. The depth d2 is preferably set according to a thickness of the electron supply layer 34 as appropriate. The two-dimensional electron layer 33a exists in a range of about a few nanometers from the interface between the electron transit layer 33 and the electron supply layer 34 and thus in order to make the anode electrode 37 form an ohmic contact with the two-dimensional hole gas layer 25a at the side wall 25b as described above, the depth d2 is more preferably 10 nm or greater.

Fourth Embodiment

Figure 5:
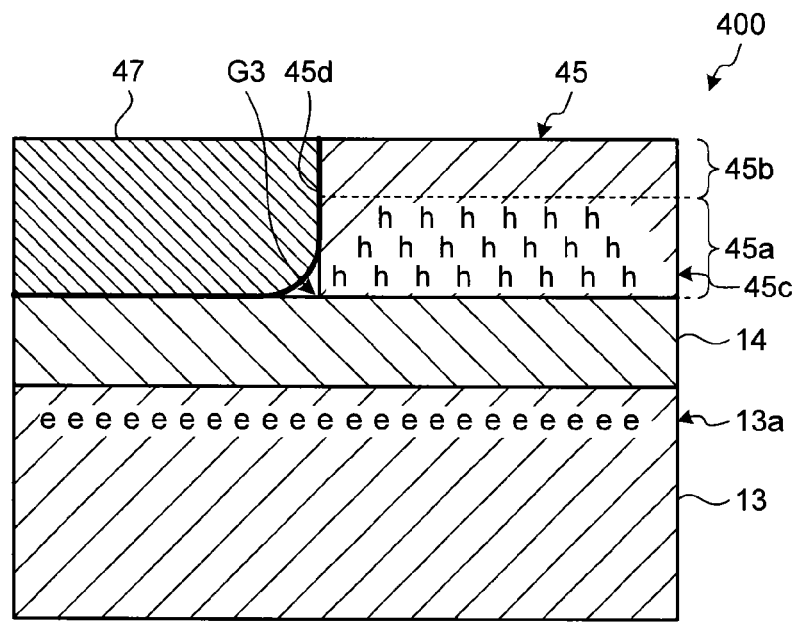
FIG. 5 is a schematic cross-sectional view of main elements of a semiconductor device according to a fourth embodiment.

FIG. 5 is a schematic cross-sectional view of main elements of a semiconductor device according to a fourth embodiment of the present invention. This semiconductor device 400 has a structure in which the field plate layer 15 and the anode electrode 17 in the semiconductor device 100 illustrated in FIG. 1 are respectively substituted with a field plate layer 45 and an anode electrode 47. Properties of preferred materials or the like for the substituted elements may be the same as the corresponding elements in the semiconductor device 100.

The field plate layer 45 includes a graded composition region 45a located on the electron supply layer 14 side, and a region 45b located on a side opposite to the electron supply layer 14 with the graded composition region 45a interposed therebetween. A composition of the graded composition region 45a varies along its thickness direction so that the band gap energy is lowered continuously or stepwisely from the electron supply layer 14 side to the side opposite to the electron supply layer 14. For example, the graded composition region 45a varies along its thickness direction so that its Al composition decreases continuously or stepwisely from the electron supply layer 14 side to the side opposite to the electron supply layer 14. The composition of the region 45b is the same as that of the graded composition region 45a adjacent thereto, for example. That is, when the composition of the graded composition region 45a is GaN at a portion adjacent to the region 45b, the region 45b may be formed of GaN also. Further, when the composition of the graded composition region 45a is AlGaN of a predetermined Al composition at the portion adjacent to the region 45b, the region 45b may be formed of AlGaN of the same Al composition also.

A side wall 45d of the field plate layer 45 is approximately perpendicular to the surface of the electron supply layer 14 in the semiconductor device 400. Because the field plate layer 45 has the graded composition region 45a, a two-dimensional hole gas layer 45c extends inside the field plate layer 45 up to a thickness approximately equal to a thickness of the graded composition region 45a. As a result, even if a gap G3 is formed at a corner formed between the side wall 45d and the surface of the electron supply layer 14, no gap exists between the anode electrode 47 and the field plate layer 45 in a range of a thickness of the two-dimensional hole gas layer 45c. The anode electrode 47, therefore, is able to form an ohmic contact with the two-dimensional hole gas layer 45c at the side wall 25b. The thickness of the graded composition region 45a is preferably 10 nm or greater.

Fifth Embodiment

Figure 6:
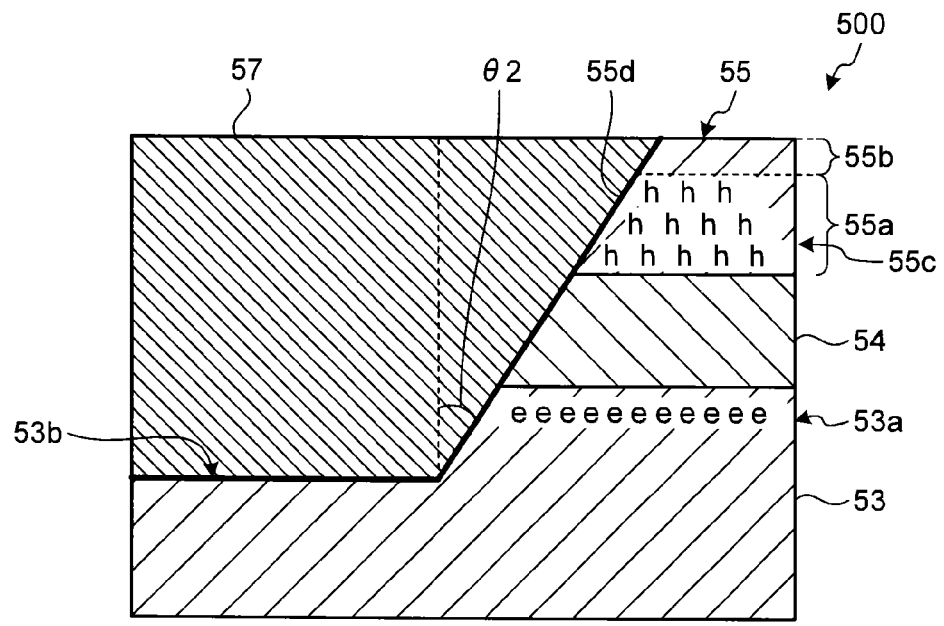
FIG. 6 is a schematic cross-sectional view of main elements of a semiconductor device according to a fifth embodiment.

FIG. 6 is a schematic cross-sectional view of main elements of a semiconductor device according to a fifth embodiment of the present invention. This semiconductor device 500 has a structure in which the electron transit layer 13, the electron supply layer 14, the field plate layer 15, and the anode electrode 17 in the semiconductor device 100 illustrated in FIG. 1 are respectively substituted with an electron transit layer 53, an electron supply layer 54, a field plate layer 55, and an anode electrode 57. A two-dimensional electron layer 53a is generated in the electron transit layer 53 at an interface between the electron transit layer 53 and the electron supply layer 54.

This semiconductor device 500 is structured by combining the structures according to the first embodiment, the third embodiment, and the fourth embodiment. Specifically, the field plate layer 55 has a graded composition region 55a located on the electron supply layer 54 side, and a region 55b located on a side opposite to the electron supply layer 54 with the graded composition region 55a interposed therebetween. A two-dimensional hole gas layer 55c thus extends inside the field plate layer 55 up to a thickness approximately equal to a thickness of the graded composition region 55a. There is also a recessed portion 53b that is formed from a surface of the electron supply layer 54 and penetrating through the electron supply layer 54 to a predetermined depth inside of the electron transit layer 53. A side wall 55d of the field plate layer 55 is tilted, with respect to a plane perpendicular to the surface of the electron supply layer 54 by an angle $\theta 2$, oppositely to the anode electrode 57.

Like this semiconductor device 500, by combining as appropriate the structures according to the embodiments as described above, effects exhibited by the structures of the embodiments may be respectively achieved while making the anode electrode form the ohmic contact with the two-dimensional hole gas layer generated at the side wall of the field plate layer.

Sixth Embodiment

Figure 7:
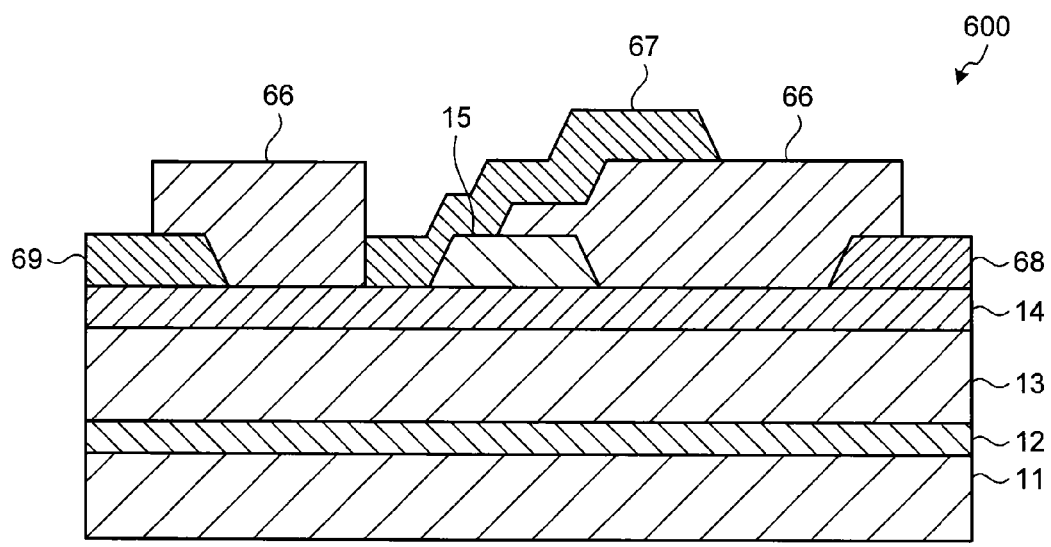
FIG. 7 is a schematic cross-sectional view of a semiconductor device according to a sixth embodiment.

FIG. 7 is a schematic cross-sectional view of a field effect transistor of high electron mobility transistor (HEMT) type, which is a semiconductor device according to a sixth embodiment of the present invention. This semiconductor device 600 has a structure in which the passivation film 16, the anode electrode 17, and the cathode electrode 18 in the semiconductor device 100 illustrated in FIG. 1 are removed and a passivation film 66, a gate electrode 67 as a second electrode, a drain electrode 68 as a first electrode, and a source electrode 69 are added.

In the semiconductor device 600, in the same manner as the semiconductor device 100 according to the first embodiment illustrated in FIG. 1, the side wall of the field plate layer 15 is tilted, with respect to a plane perpendicular to the surface of the electron supply layer 14, by a predetermined angle oppositely to the gate electrode 67. This makes the gate electrode 67 form an ohmic contact with a two-dimensional hole gas layer generated in the field plate layer 15 at the side wall of the field plate layer 15.

With respect to this semiconductor device 600, not being limited to a structure similar to the first embodiment, one or any combination, as appropriate, of the structures according to the second to fifth embodiments may be applied, to realize the ohmic contact between the gate electrode and the two-dimensional hole gas layer and obtain effects exhibited by the structures according to the embodiments respectively. When the structure according to the third embodiment is applied, because no two-dimensional hole gas layer is generated directly under the recessed portion, the semiconductor device becomes a field effect transistor of metal-semiconductor (MES) type.

In the above-described embodiments, the electron supply layer is made of AlGaN, and the electron transit layer and the field plate layer are made of GaN. However, the materials making up these layers are not limited to the ones described above. Specifically, the electron supply layer may be made of any group III nitride-based compound semiconductor that has a higher band gap energy than the electron transit layer and the field plate layer may be made of any non-p-type group III nitride-based compound semiconductor that has a lower band gap energy than the electron supply layer. The group III nitride-based compound semiconductor is represented by the following chemical formula: $Al_xIn_yGa_{1-x-y}As_uP_vN_{1-u-v}$ (where $0 \leq x \leq 1$, $0 \leq y \leq 1$, $x+y \leq 1$, $0 \leq u < 1$, $0 \leq v < 1$, and $u+v<1$).

According to an embodiment of the present invention, a semiconductor device in which reduction in its voltage endurance is suppressed and its leakage current is effectively suppressed is able to be realized.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A semiconductor device, comprising:
   an electron transit layer that is formed on a substrate and formed of a group III nitride-based compound semiconductor;
   an electron supply layer that is formed on the electron transit layer and formed of a group III nitride-based compound semiconductor having a higher band gap energy than the electron transit layer;
   a field plate layer that is formed on the electron supply layer, is formed of a non-p-type group III nitride-based compound semiconductor, and has a lower band gap energy than the electron supply layer;
   a first electrode that is formed so as to form an ohmic contact with a two-dimensional electron gas layer generated in the electron transit layer at an interface between the electron transit layer and the electron supply layer; and
   a second electrode that is formed so as to form a Schottky contact with the two-dimensional electron gas layer, wherein
   the second electrode forms an ohmic contact, at a side wall of the field plate layer, with two-dimensional hole gas generated in the field plate layer at an interface between the field plate layer and the electron supply layer.

2. The semiconductor device according to claim 1, wherein the side wall of the field plate layer is tilted, with respect to a plane perpendicular to a surface of the electron supply layer, opposite to the second electrode.

3. The semiconductor device according to claim 1, further comprising a recessed portion that is formed from the surface of the electron supply layer to a predetermined depth in the electron supply layer or the electron transit layer, wherein the second electrode is formed from inside of the recessed portion to the side wall of the field plate layer.

4. The semiconductor device according to claim 3, wherein the predetermined depth, from the surface of the electron supply layer, of the recessed portion is 10 nm or greater, and
   a thickness of the electron transit layer directly under the recessed portion is 20 nm or greater.

5. The semiconductor device according to claim 1, wherein the field plate layer has a region that is located at an electron supply layer side and has band gap energy that continuously or stepwisely decreases from the electron supply layer side to a side opposite to the electron supply layer.

6. The semiconductor device according to claim 5, wherein a thickness of the region is 10 nm or greater.

7. The semiconductor device according to claim 1, wherein the second electrode is formed on at least a part of a top surface of the field plate layer of the non-p-type.

* * * * *